United States Patent [19]

Agarwal et al.

[11] Patent Number: 5,323,400
[45] Date of Patent: Jun. 21, 1994

[54] SCAN CELL FOR WEIGHTED RANDOM PATTERN GENERATION AND METHOD FOR ITS OPERATION

[75] Inventors: Vinod Agarwal, Brossard; Benoit Nadeau-Dostie, Aylmer, both of Canada; Fidel Muradali, Tokyo, Japan

[73] Assignee: Northern Telecom Limited, Montreal, Canada

[21] Appl. No.: 756,703

[22] Filed: Sep. 9, 1991

[51] Int. Cl.$^5$ .............................. H04B 17/00
[52] U.S. Cl. .................... 371/22.3; 371/27
[58] Field of Search ............... 371/22.3, 27, 15.1, 371/22.1, 22.5, 22.6; 324/73.1, 158 R

[56] References Cited

U.S. PATENT DOCUMENTS

| | | | |
|---|---|---|---|
| 4,366,393 | 12/1982 | Kasuya | 371/22.3 |
| 4,687,988 | 8/1987 | Eichelberger et al. | 324/73 AT |
| 4,688,223 | 8/1987 | Motika et al. | 371/27 |
| 4,745,355 | 5/1988 | Eichelberger et al. | 324/73 R |
| 5,043,988 | 8/1991 | Brglez et al. | 371/27 |

OTHER PUBLICATIONS

"Built-In Test for Complex Digital Integrated Circuits", Koneman et al, IEEE Journal of Solid State Circuits, vol. SC-15, No. 3, pp. 315-319, Jun. 1990.

"A New Procedure for Weighted Random Built-In Self-Test", Muradali et al, Proceedings of the 1990 International Tsst Conference, (Paper 30.2, pp. 660-669), published Sep. 10, 1990.

*Primary Examiner*—Robert W. Beausoliel, Jr.
*Assistant Examiner*—Phung M. Chung
*Attorney, Agent, or Firm*—C. W. Junkin

[57] ABSTRACT

A scan cell comprises a flip-flop, a mode selector and a weighting network. The mode selector responds to a mode-select signal by selectively applying a circuit data input signal or a scan data input signal to a data input of the flip-flop. The weighting network responds to one logic state of a weight-select signal by applying a circuit data signal substantially identical to a scan data output signal appearing at a scan data output of the flip-flop to a circuit data output. The weighting network responds to another logic state of the weightselect signal by applying a circuit data output signal having a predetermined ratio of occurrences of one logic state to occurrences of another logic state to the circuit data output. The scan cell is used for generating weighted random patterns in scan chains for scan testing digital systems.

15 Claims, 4 Drawing Sheets

SCAN CELL FOR WEIGHTED RANDOM PATTERN GENERATION AND METHOD FOR ITS OPERATION

FIELD OF THE INVENTION

This invention relates to weighted random pattern generation for testing complex digital systems such as very large scale integration (VLSI) digital circuits. The invention relates particularly to cells used in scan chains for scan testing of such digital systems.

BACKGROUND OF THE INVENTION

Conventional digital integrated circuits comprise complex combinational networks for performing logical operations on data, and memory elements interconnected with the combinational networks to provide memory functions essential to the operation of the combinational networks. Such integrated circuits are difficult to test due to the complexity of their operation.

Modern digital integrated circuit designers incorporate test features in digital integrated circuits at the design stage to ensure that such circuits are testable. In one design technique, known as Level Sensitive Scan Design (LSSD), designers partition circuits into combinational networks and scannable memory elements, usually flip-flops. The flip-flops are made reconfigurable from their operating configuration (in which they are connected to the combinational networks of the circuit is required to support normal operation of the circuit) to as scan configuration in which they are decoupled from the combinational networks and connected in series to form one or more shift registers known as "scan chains".

The scan configuration is used during testing of the circuit to shift a known test stimulus pattern into the scan chains. The flip-flops are then put into the operating configuration for one or more clock cycles so that combinational networks perform logical operations on some of the data making up the test stimulus pattern and alter the data stored in some of the flip-flops. The flip-flops are then returned to the scan configuration to shift the altered data out of the scan chains as test response patterns. The test response patterns are compared with calculated test response patterns or with test response patterns obtained from a circuit which is known to be functioning properly to determine whether the circuit under test is functioning properly.

The known test stimulus pattern may be a random pattern supplied by a random pattern generator which is internal or external to the digital system under test. The random pattern may even be generated within the scan chain by configuring the scan chain as a linear feedback shift register (LFSR) (see for example Konemann et al, IEEE Journal of Solid State Circuits, Vol. SC-15, No. 3, p. 315-319, June 1980).

Conventional random pattern scan testing can require very large numbers of random patterns for an acceptable level of fault coverage. Most faults can be detected by any one of several random patterns and these faults are usually detected during the early stages of random pattern testing. However a smaller number of faults can only be detected by very specific test patterns, and many more random patterns must be applied to ensure that these specific patterns are applied.

In a hybrid test approach, random pattern testing can be combined with stored pattern testing, the random patterns being used for detection of easily detected faults with a relatively small number of random patterns and the stored patterns being used for detection of faults which require very specific patterns for detection. Unfortunately, the number of stored patterns required for acceptable fault coverage can be very large even when stored pattern testing is combined with random pattern testing, so that test apparatus having very large storage capacity is needed.

In another hybrid test approach, random pattern testing can be combined with "biased" or "weighted" random pattern testing. "Weighted" random patterns (WRP) are patterns in which one logic state occurs more frequently than another logic state, the "weight" of the pattern being the ratio of occurrences of one logic state (e.g. the "1" state) to the other state (e.g. the "0" state). WRP testing can significantly reduce the number of test patterns needed for acceptable fault coverage.

Unfortunately, known on-chip WRP generators are significantly more complicated and consume significantly more area than uniform random pattern generators. Consequently the cost overhead of implementing a WRP builtin self test (BIST) strategy is relatively high.

SUMMARY OF THE INVENTION

This invention seeks to provide a scan cell for use in a scan chain in conjunction with a uniform random pattern generator to provide area-efficient weighted random pattern generation.

The uniform random pattern generator may be provided on-chip with the scan chain in a true BIST configuration or may be provided in off-chip test apparatus connected to the on-chip scan chain.

Accordingly, one aspect of the invention provides a scan cell which comprises a flip-flop, mode-select means and weighting means. The mode-select means is responsive to a first logic state of a mode-select signal to couple a circuit data input signal to a data input of the flip-flop, and is responsive to a second logic state of the mode-select signal to couple a scan data input signal to the data input of the flip-flop. The weighting means is responsive to a first logic state of a weight-select signal to apply a circuit data output signal substantially identical to a scan data output signal appearing at a scan data output of the flip-flop to a circuit data output of the weighting means, and is responsive to a second logic state of the weight-select signal to apply a circuit data output signal having a predetermined ratio of occurrences of one logic state to occurrences of another logic state to the circuit data output.

Another aspect of the invention provides a scan chain comprising a plurality of scan cells connected serially to form a shift register, at least one of the scan cells being a scan cell as defined above.

Another aspect of the invention provides a novel method for generating a weighted random pattern at a scan cell of a scan chain. The method comprises scanning a random pattern into the scan chain and logically combining at least one bit of the random pattern with a weight-select signal in the scan cell to generate a weighted random pattern having a predetermined ratio of occurrences of one logic state to occurrences of another logic state at that scan cell.

In the above method, a plurality of bits of the random pattern may be logically combined with the weight-select signal in the scan cell to generate the weighted random pattern. The weight-select signal may have a predetermined pattern, or may be a uniform random pattern or a weighted random pattern.

Another aspect of the invention provides a method for generating a plurality of weighted random patterns at respective scan cells of a scan chain. This method comprises scanning a random pattern into the scan chain and logically combining at least one bit of the random pattern with a weight-select signal in each of the respective scan cells to generate a respective weighted random pattern having a respective predetermined ratio of occurrences of one logic state to occurrences of another logic state at that scan cell.

BRIEF DESCRIPTION OF DRAWINGS

Embodiments of the invention are described below by way of example only. Reference is made to accompanying drawings, in which.

DETAILED DESCRIPTION OF EMBODIMENTS

Figure 1:
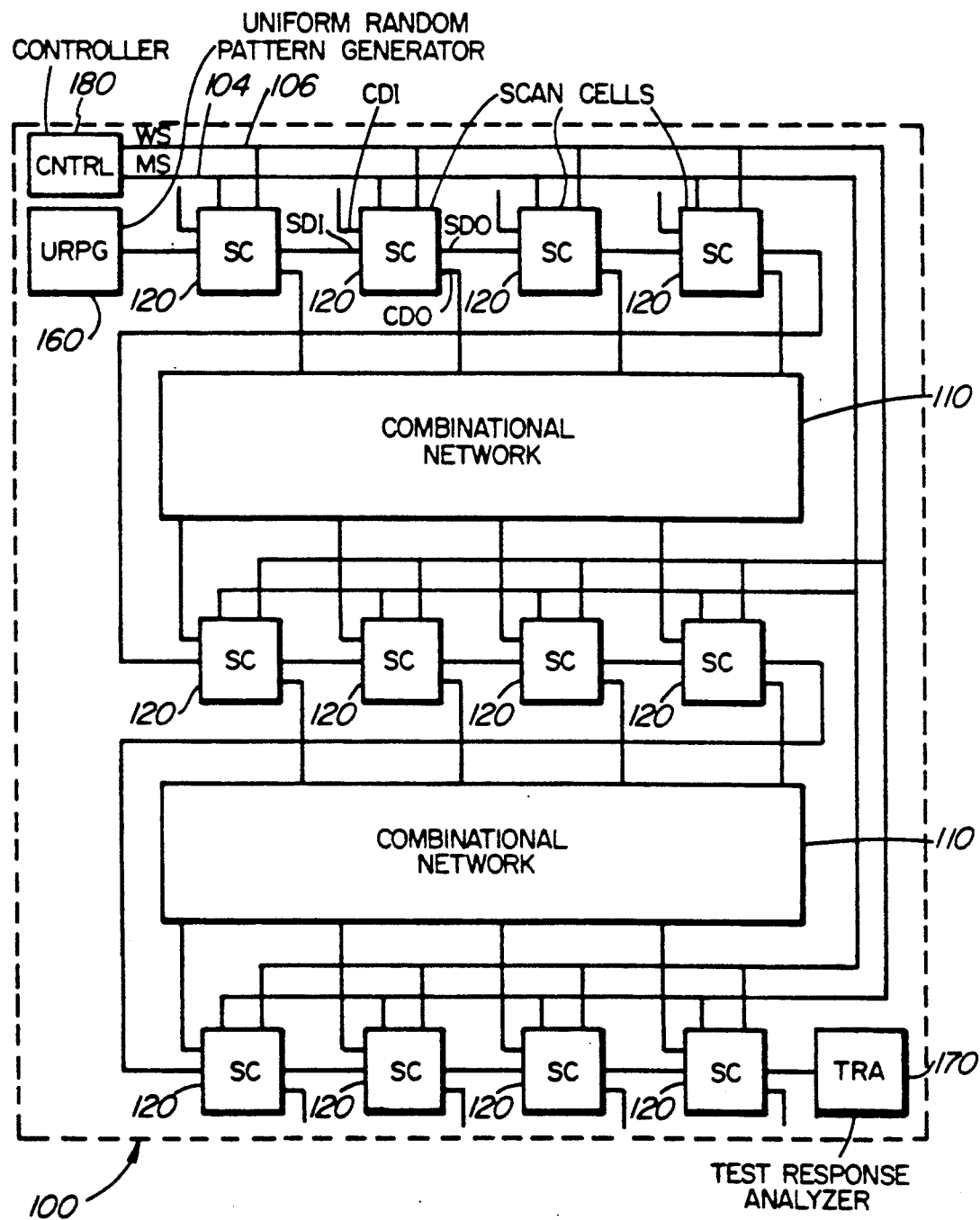
FIG. 1 is a block schematic diagram of a system architecture for weighted random pattern (WRP) scan testing of a digital system.

FIG. 1 is a block schematic diagram of a system architecture for weighted random pattern (WRP) scan testing of a digital system such as a VLSI circuit 100. The VLSI circuit 100 comprises combinational networks 110 for performing logical operations on data, and memory elements in the form of scan cells 120.

Figure 2:
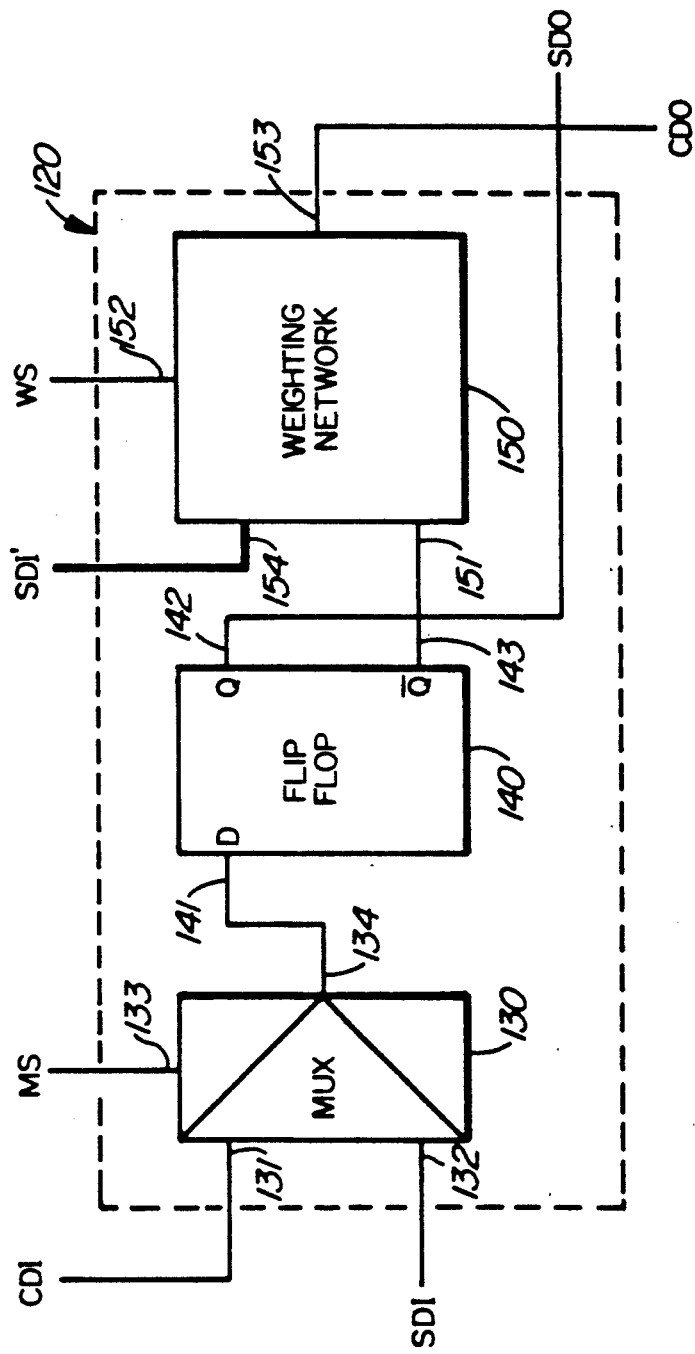
FIG. 2 is a block schematic diagram of a generic scan cell used in system architecture of FIG. 1.

FIG. 2 is a block schematic diagram of a generic scan cell 120. Each scan cell 120 comprises mode select means in the form of a 2-to-1 data multiplexer 130, a flip-flop 140 and weighting means in the form of a weighting network 150.

The multiplexer 130 has data inputs 131, 132 connected respectively to a circuit data input CDI and a scan data input SDI of the scan cell 120, a select input 133 connected to a mode select input MS of the scan cell 120 and an output 134 connected to a data input 141 of the flip-flop 140. The multiplexer 130 responds to a first logic state of a mode-select signal on MS by coupling a circuit data input signal on CDI to the data input 141 of the flip-flop 140, and responds to a second logic state of the mode-select signal by coupling a scan data input signal on SDI to the data input 141 of the flip-flop 140.

The flip-flop 140 has a non-inverting output 142 which is connected to a scan data output SDO of the scan cell 120, and an inverting output 143 which is connected to a first input 151 of the weighting network 150. (As shown in FIG. 2 and in particular embodiments shown in FIGS. 3 to 6, the first input 151 of the weighting network 150 is connected to the inverted data output 143 of the flip-flop 140, but in other embodiments the first input 151 could be connected to the non-inverted data output 142 of the flip-flop 140.)

In addition to the first input 151, the weighting network 150 has a second input 152 which is connected to weight-select input WS of the scan cell 120 and an output 153 which is connected to a circuit data output CDO of the scan cell 120. The weighting network may also have additional inputs 154 connected to other scan data inputs SDI, of the scan cell 120 for connection to scan data outputs of other scan cells 120. The weighting network 150 responds to a first logic state of a weight-select signal on WS by applying a circuit data output signal substantially identical to a scan data output signal appearing at SDO to CDO. The weighting network 150 responds to a second logic state of the weight-select signal on WS to apply a circuit data output signal having a predetermined ratio of occurrences of one logic state to occurrences of another logic state to CDO.

As shown in FIG. 1, the scan cells 120 are connected serially SDO to SDI to define a shift register for use as a scan chain. The scan cells 120 are also connected in parallel to the combinational networks 110 and to inputs of the VLSI circuit 100 via their circuit data terminals CDI, CDO. The mode-select and weight-select inputs MS, WS are connected to common mode-select and weight-select lines 104, 106 respectively. The mode-select and weight-select lines 104, 106 are connected to a controller 180. In a true BIST configuration the controller 180 is internal to the VLSI circuit 100 as shown in FIG. 1, but in alternative configurations it could be resident in test apparatus external to the VLSI circuit 100.

For normal operation of the VLSI circuit 100, a first logic state is applied to the mode-select line 104 so that the multiplexer 130 of each scan cell 120 selects the circuit data input CDI, and a first logic state is applied to the weight-select line 106 so that the weighting network of each scan cell 120 applies to its circuit data output CDO a signal which is substantially identical to the noninverted output of its flip-flop 140. In this configuration, the flip-flops 140 are effectively directly connected to the combinational networks 110 to provide memory functions essential to the normal operation of the combinational networks 110.

The scan cells 120 are reconfigured in a scan configuration by applying a second logic state to the mode select line 104. In this configuration, the multiplexer 130 of each scan cell 120 decouples its flip-flop 140 from its circuit data input CDI and recouples it to its scan data input SDI so that the scan cells 120 are connected in series to form a scan chain. A uniform random pattern generator (URPG) 160 is connected to the scan data input SDI of a scan cell 120 at an input end of the scan chain, and a test response analyzer (TRA) 170 is connected to the scan data output SDO of a scan cell at an output end of the scan chain. In a true BIST configuration, the URPG 160 and the TRA 170 are internal to the VLSI circuit 100 as shown in FIG. 1. However, in alternative configurations, the URPG 160 and the TRA 170 could be resident in test apparatus external to the VLSI circuit 100.

In normal scan testing of the VLSI circuit 100, the scan cells 120 are put in scan configuration and a uniform random pattern (i.e. a random pattern having a weight of 0.5) is scanned from the URPG 160 into the flip-flops 140 of the scan cells 120. When the uniform random pattern is loaded into the flip-flops 140, the scan cells 120 are put in normal operating configuration for one or more clock cycles to couple the uniform random pattern into the combinational networks 110 and to couple a corresponding test result pattern out of the combinational networks into the flip-flops 140. The scan cells 120 are then returned to scan configuration to scan the test result pattern out of the flip-flops to the TRA 170 for analysis.

The scan cells 120 can also be reconfigured in a WRP test configuration by applying a second logic state to the weight-select line 106. In this configuration, the weighting networks 150 of the scan cells 120 modify bits of the uniform random pattern as they are passed from the flip-flops 140 to the combinational networks 110 and pins 102 of the VLSI circuit 100 by logically combining them with the weight-select signal. In particular, the weighting networks modify the "weight" (or ratio of logical ones to logical zeroes) of random patterns applied to the combinational networks 110 of the VLSI circuit 100.

Thus, in WRP scan testing of the VLSI circuit 100, the scan cells 120 are put in scan configuration and a uniform random pattern (i.e. a random pattern having a weight of 0.5) is scanned from the URPG 160 into the flip-flops 140 of the scan cells 120. When the uniform random pattern is loaded into the flip-flops 140, the scan cells 120 are put in WRP test configuration for one or more clock cycles to couple a weighted random pattern into the combinational networks 110 and to couple a corresponding test result pattern out of the combinational networks 110 into the flip-flops 140. The scan cells 120 are then returned to scan configuration to scan the test result pattern out of the flip-flops to the TRA 170 for analysis.

The logical state of the weight-select signal does not affect the operation of the scan cells 120 in the scan configuration (i.e when the mode-select signal is in its second logical state). Consequently the weight-select signal can be held in its first logical state throughout normal scan testing of the VLSI circuit 100, and can be held in its second logical state throughout WRP testing of the VLSI circuit 100.

The weighting network 150 of each scan cell 120 is selected to provide a desired .weight., or ratio of logical ones to logical zeroes. Scan cells 320, 420, 520, 620 having four such weighting networks 350, 450, 550, 650 are shown in FIGS. 3, 4, 5 and 6 respectively.

Figure 3:
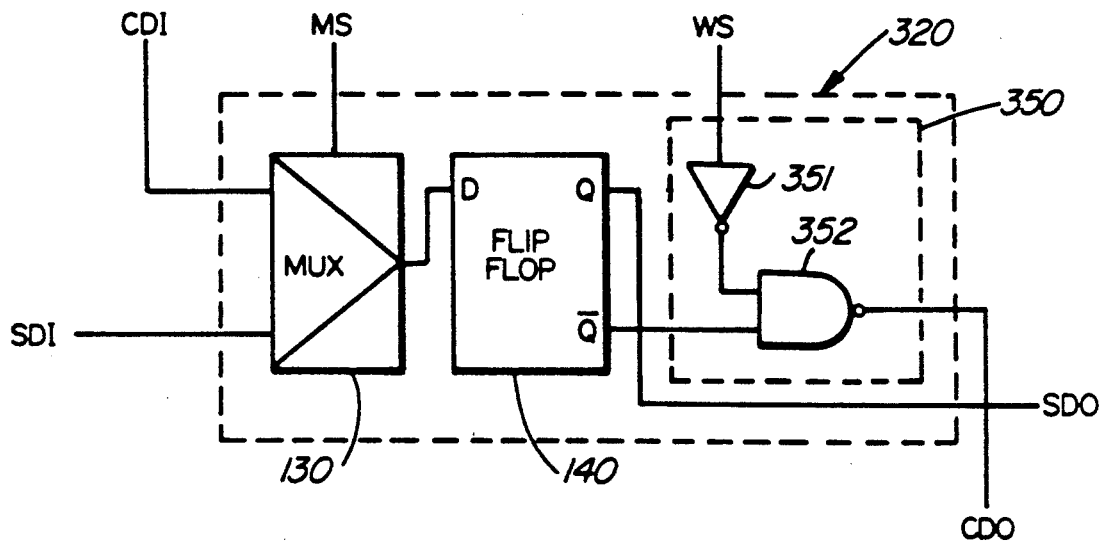
FIG. 3 is a block schematic diagram of a scan cell for providing a WRP having a weight of 1.

Scan cell 320 shown in FIG. 3 has a weighting network 350 comprising an inverter 351 which inverts the weight-select signal and a NAND gate 352 which combines the inverted weight-select signal and the inverted scan data output signal to generate a circuit data output signal identical to the scan data output signal when the weight-select signal is a logical zero and which is modified to have a weight of 1 when the weight-select signal is a logical one.

Figure 4:
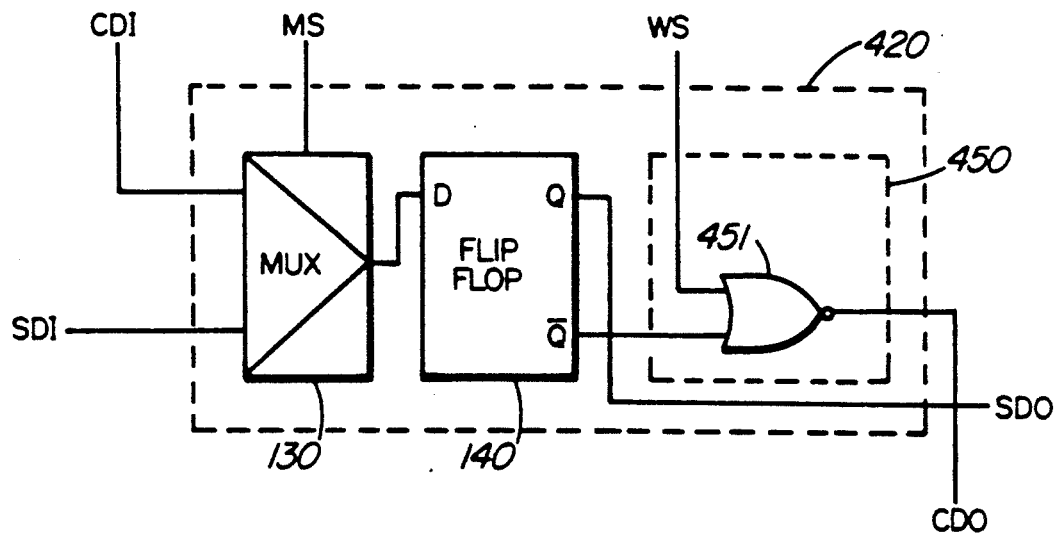
FIG. 4 is a block schematic diagram of a scan cell for providing a WRP, having a weight of 0.

Scan cell 420 shown in FIG. 4 has a weighting network 450 comprising a NOR gate 451 which combines the weight-select signal and the inverted scan data output signal to generate a circuit data output signal identical to the scan data output signal when the weight-select signal is a logical zero and which is modified to have a weight of 0 when the weight-select signal is a logical one.

Figure 5:
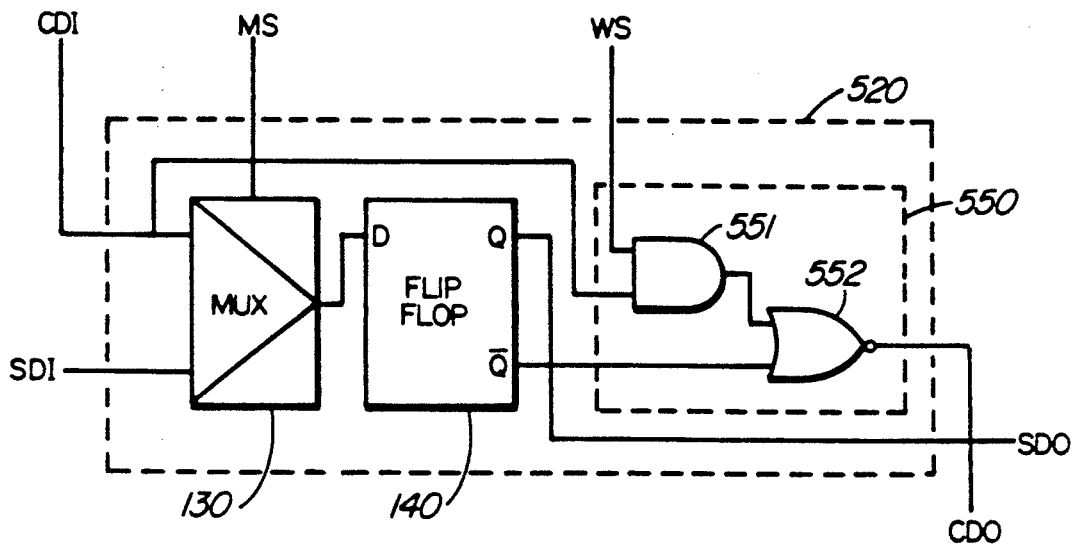
FIG. 5 is a block schematic diagram of a scan cell for providing a WRP having a weight of 0.25.

Scan cell 520 shown in FIG. 5 has a weighting network 550 comprising an AND-OR-INVERT gate which combines the weight-select signal, the circuit data input signal, and the inverted scan data output signal to generate a circuit data output signal identical to the scan data output signal when the weight-select signal is a logical zero and which is modified to have a weight of 0.25 when the weight-select signal is a logical one. The AND-OR-INVERT gate is shown schematically in FIG. 5 in the conventional manner as an AND gate 551 and a NOR gate 552. However, it is well known to digital circuit designers that the AND-OR-INVERT function can be realized in CMOS circuits as a single AND-OR-INVERT gate having a smaller area than separate AND and NOR gates connected as shown in FIG. 5. Separate AND and NOR gates are preferred for performing the AND-OR-INVERT function only where high operating speed is more important than area efficiency.

Figure 6:
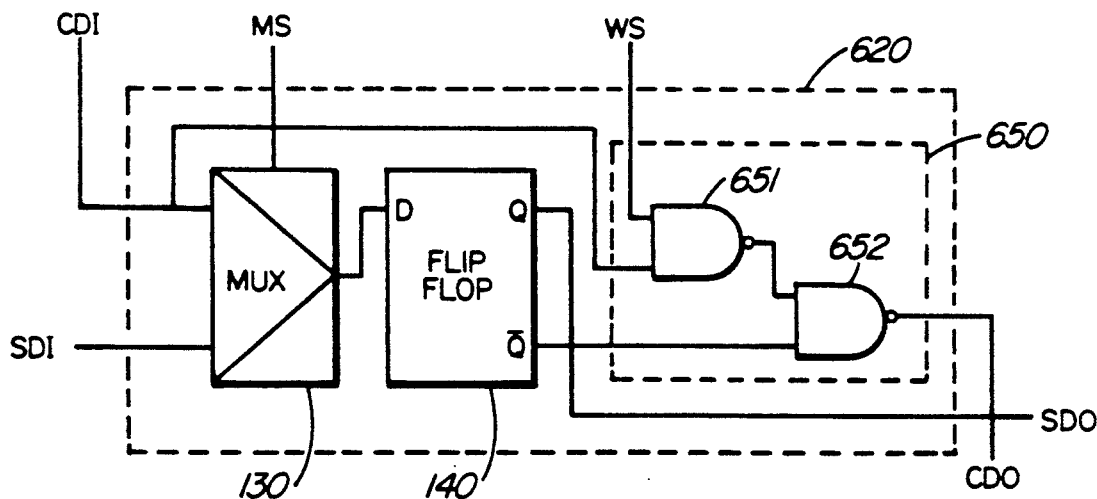
FIG. 6 is a block schematic diagram of a scan cell for providing a WRP having a weight of 0.75.

Scan cell 620 shown in FIG. 6 has a weighting network 650 comprising a NAND gate 651 which combines the weight-select signal and the circuit data input signal, and a NAND gate 652 which combines the output of the NAND gate 651 and the inverted scan data output signal to generate a circuit data output signal identical to the scan data output signal when the weight-select signal is a logical zero and which is modified to have a weight of 0.75 when the weight-select signal is a logical one.

A conventional scan cell having no weighting network and a circuit data output CDO connected to its scan data output SDO can be used to provide a weight of 0.5 where desired.

Scan cells 120 providing other desired weights can be designed by suitable modification of the weighting network 150. In general, it may be necessary to couple one or more other bits of a uniform random pattern from other scan cells 120 of the scan chain to the weighting network 150 of a particular scan cell 120 for logical combination with the weight-select signal to achieve a desired weighting at that scan cell 120. For example, the scan cells 520, 620 shown in FIGS. 5 and 6 effectively have connections from the scan data outputs of adjacent scan cells to inputs of their respective weighting networks 550, 650. For this reason, FIG. 2 shows one or more additional scan data inputs SDI' connected to corresponding inputs 154 of the weighting network 150 although such additional inputs are not required in every case (see FIGS. 3 and 4 for example).

Suitable weights for efficient WRP scan testing of a particular VLSI circuit 100 can be estimated using an algorithm disclosed by Muradali et al in the Proceedings of the 1990 International Test Conference (Paper 30.2, p. 660–669,published Sept. 10, 1990) which is hereby incorporated by reference. In general, different weights will be desired at individual scan cells 120 of a scan chain, so not all scan cells 120 will have the same weighting network 150. Indeed, weighting may prove to be of little value at some locations in the scan chain, and conventional scan cells having no weighting networks may be used in these locations.

WRP scan testing may be used in conjunction with uniform random pattern scan testing for efficient testing of VLSI circuits and other digital systems. The uniform random pattern testing may be performed first (with the weight-select signal in its first logical state) to test for easily detected faults, followed by WRP testing (with the weight-select signal in its second logical state) to test for pattern resistant faults. Alternatively, the order of WRP and uniform random pattern testing could be reversed, or WRP and uniform random pattern testing could be interspersed by driving the weight-select line with a uniform or weighted random pattern, the weight selected in accordance with the desired proportion of uniform random pattern and WRP testing desired.

Although FIG. 1 shows only one scan chain connected to the URPG 160 and the TRA 170 on the VLSI circuit 100, the VLSI circuit 100 may be partitioned into a plurality of subcircuits for testing purposes, each subcircuit having its own memory elements configurable as a scan chain. In such a configuration, the URPG 160 can feed random patterns to the plural scan chains in parallel, and the TRA 170 can include circuitry for compressing test result patterns received in parallel from the plural scan chains into a single test result pattern for analysis.

The URPG 160, TRA 170 and controller 180 could be provided as part of the VLSI circuit 100 or could be provided off-chip. Hybrid configurations in which some of the test functionality is provided on-chip and some is located off-chip in test apparatus are also possible.

These and other variations of the invention, specific embodiments of which are described above, are intended to be within the scope of the invention as claimed below.

We claim:

1. A scan cell, comprising:
   a flip-flop;
   mode-select means responsive to a first logic state of a mode-select signal to couple a circuit data input signal to a data input of the flip-flop and responsive to a second logic state of the mode-select signal to couple a scan data input signal to the data input of the flip-flop; and
   weighting means responsive to a first logic state of a weight-select signal to apply a circuit data output signal substantially identical to a scan data output signal appearing at a scan data output of the flip-flop to a circuit data output of the weighting means and responsive to a second logic state of the weight-select signal to apply a circuit data output signal having a predetermined ratio of occurrences of one logic state to occurrences of another logic state to the circuit data output.

2. A scan cell as defined in claim 1, wherein the weighting means comprises a combinational network which is responsive to the weight-select signal and the scan data output signal to generate the circuit data output signal.

3. A scan cell as defined in claim 2, wherein an inverted scan data output signal is coupled from an inverted data output of the flip-flop to an input of the weighting means.

4. A scan cell as defined in claim 3, wherein the weighting means comprises:
   an inverter responsive to the weight-select signal to generate an inverted weight-select signal; and
   a NAND gate responsive to the inverted weight-select signal and the inverted scan data output signal to generate the circuit data output signal.

5. A scan cell as defined in claim 2, wherein at least one other scan data output signal is coupled from another scan cell to an input of the weighting means and the weighting means is responsive to the weight-select signal, the scan data output signal and the at least one other scan data output signal to generate the circuit data output signal.

6. A scan cell as defined in claim 3, wherein the weighting means comprises a NOR gate responsive to the weight-select signal and the inverted scan data signal to generate the circuit data output signal.

7. A scan cell as defined in claim 3, wherein the weighting means comprises an AND-OR-INVERT gate responsive to the weight-select signal, the scan data input signal and an inverted scan data output signal to generate the circuit data output signal.

8. A scan cell as defined in claim 3, wherein the weighting means comprises:
   an AND gate responsive to the weight-select signal and the scan data input signal to generate an AND output signal; and
   a NOR gate responsive to the AND output signal and an inverted scan data output signal to generate the circuit data output signal.

9. A scan cell as defined in claim 3, wherein the weighting means comprises:
   a first NAND gate responsive to the weight-select signal and the scan data input signal to generate a first NAND output signal; and
   a second NAND gate responsive to the first NAND output signal and an inverted scan data output signal to generate the circuit data output signal.

10. A scan chain, comprising a plurality of scan cells connected serially to form a shift register, at least one of the scan cells comprising:
    a flip flop;
    mode-select means responsive to a first logic state of a mode-select signal to couple a circuit data input signal to a data input of the flip-flop and responsive to a second logic state of the mode-select signal to couple a scan data input signal to the data input of the flip-flop; and
    weighting means responsive to a first logic state of a weight-select signal to apply a circuit data output signal substantially identical to a scan data output signal appearing at a scan data output of the flip-flop to a circuit data output of the weighting means and responsive to a second logic state of the weight-select signal to apply a circuit data output signal having a predetermined ratio of occurrences of one logic state to occurrences of another logic state to the circuit data output.

11. A method for generating a weighted random pattern at a scan cell of a scan chain for scan testing a digital system, the method comprising:
    serially transferring bits of a substantially uniform random pattern from scan cell to scan cell along the scan chain to load the random pattern into the scan chain; and
    logically combining at least one bit of the random pattern with a weight-select signal in the scan cell to generate a weighted random pattern having a predetermined ratio of occurrence of one logic state to occurrences of another logic state at that scan cell.

12. A method as defined in claim 11, comprising logically combining a plurality of bits of the random pattern with the weight-select signal in the scan cell to generate the weighted random pattern.

13. A method as defined in claim 11, wherein the weight-select signal is a random pattern.

14. A method as defined in claim 13, wherein the weight-select signal is a weighted random pattern.

15. A method for generating a plurality of weighted random patterns at respective san cells of a scan chain for scan testing a digital system, the method comprising:
    serially transferring bits of a substantially uniform random pattern from scan cell of a scan cell along the scan chain to load the random pattern into the scan chain; and
    logically combining at least one bit of the random pattern with a weight-select signal in each of the respective scan cells to generate a respective weighted random pattern having a predetermined ratio of occurrences of one logic state to occurrences of another logic state at that scan cell.

* * * * *

UNITED STATES PATENT AND TRADEMARK OFFICE
CERTIFICATE OF CORRECTION

PATENT NO.   : 5,323,400
DATED        : 21 June 1994
INVENTOR(S)  : AGARWAL, Vinod; NADEAU-DOSTIE, Benoit; MURADALI, Fidel It is certified that error appears in the above-indentified patent and that said Letters Patent is hereby corrected as shown below:

On sheet 4 of the Drawings, in Figure 5,
labels "CDI" and "SDI" should be interchanged.

On sheet 4 of the Drawings, in Figure 6,
labels "CDI" and "SDI" should be interchanged.

At column 5, line 61, "circuit" should read "scan".

At column 6, line 12, "circuit" should read "scan".

Signed and Sealed this

Eleventh Day of April, 1995

*Attest:*

BRUCE LEHMAN

*Attesting Officer*   *Commissioner of Patents and Trademarks*